(12) United States Patent
Wang et al.

(10) Patent No.: US 7,564,887 B2
(45) Date of Patent: Jul. 21, 2009

(54) LONG WAVELENGTH VERTICAL CAVITY SURFACE EMITTING LASERS

(75) Inventors: Tzu-Yu Wang, Maple Grove, MN (US); Jin K. Kim, St. Louis Park, MN (US)

(73) Assignee: Finisar Corporation, Sunnyvale, CA (US)

( * ) Notice: Subject to any disclaimer, the term of this patent is extended or adjusted under 35 U.S.C. 154(b) by 287 days.

(21) Appl. No.: 11/066,793

(22) Filed: Feb. 25, 2005

(65) Prior Publication Data
US 2006/0002444 A1  Jan. 5, 2006

Related U.S. Application Data

(60) Provisional application No. 60/583,980, filed on Jun. 30, 2004.

(51) Int. Cl.
*H01S 5/00* (2006.01)
*H01S 3/08* (2006.01)

(52) U.S. Cl. .............................. 372/50.124; 372/50.11; 372/92

(58) Field of Classification Search ............ 372/50.124, 372/50.11, 92
See application file for complete search history.

(56) References Cited

U.S. PATENT DOCUMENTS

| | | | | |
|---|---|---|---|---|
| 5,115,441 A | * | 5/1992 | Kopf et al. ............... | 372/45.01 |
| 5,256,596 A | * | 10/1993 | Ackley et al. ............ | 438/39 |
| 6,185,241 B1 | * | 2/2001 | Sun .......................... | 372/96 |
| 6,208,680 B1 | * | 3/2001 | Chirovsky et al. ........ | 372/96 |
| 6,362,069 B1 | * | 3/2002 | Forrest et al. ............ | 438/401 |
| 6,658,040 B1 | * | 12/2003 | Hu et al. ................... | 372/96 |
| 6,751,245 B1 | * | 6/2004 | Wasserbauer et al. .... | 372/46.01 |
| 6,798,806 B1 | * | 9/2004 | Johnson et al. .......... | 372/43.01 |
| 6,885,690 B2 | * | 4/2005 | Aggerstam et al. ....... | 372/96 |
| 2003/0063642 A1 | * | 4/2003 | Aggerstam et al. ....... | 372/45 |
| 2003/0096439 A1 | * | 5/2003 | Lee et al. ................. | 438/47 |
| 2003/0138017 A1 | * | 7/2003 | Lee et al. ................. | 372/46 |
| 2004/0264531 A1 | * | 12/2004 | Ryou et al. ............... | 372/45 |

* cited by examiner

*Primary Examiner*—Minsun Harvey
*Assistant Examiner*—Phillip Nguyen
(74) *Attorney, Agent, or Firm*—Workman Nydegger

(57) ABSTRACT

A vertical cavity surface emitting laser (VCSEL) includes independently definable current and optical confinement structures that provide unique forms of drive current and transverse mode confinement, respectively. The optical guide may be formed from an upper distributed Bragg reflector (DBR), as an etched mesa structure and/or as an intracavity optical guide. The current guide may include an ion-implanted region within the upper DBR. A dielectric structure is formed over the upper DBR and surrounds the optical guide.

23 Claims, 5 Drawing Sheets

FIGURE 1

| E1 | A1 | E1 |
|---|---|---|
| E2 | A2 | E2 |
| E3 | A3 | E3 |
| F1 | B1 | F1 |
| F2 | B2 | F2 |
| F3 | B3 | F3 |
| G1 | C1 | G1 |
| G2 | C2 | G2 |
| G3 | C3 | G3 |
| H1 | D1 | H1 |
| H2 | D2 | H2 |

LONG WAVELENGTH VERTICAL CAVITY SURFACE EMITTING LASERS

CROSS-REFERENCE TO RELATED APPLICATIONS

This application claims benefit to U.S. Provisional Application Ser. No. 60/583,980, filed on Jun. 30, 2004, which is incorporated herein.

BACKGROUND OF THE INVENTION

1. Field of the Invention

The present invention relates generally to vertical cavity surface emitting lasers (VCSELs). More particularly, the present invention relates to VCSELs which provide independently definable current confinement and optical mode confinement.

2. Field of the Invention

As compared with conventional edge-emitting semiconductor lasers, vertical cavity surface emitting lasers (VCSELs) hold the promise of a number of desirable characteristics. For example, shorter cavity resonator VCSELs provide excellent mode selectivity and, therefore, narrower linewidths. Use of multi-layered distributed Bragg reflectors (DBRs) to form a cavity resonator perpendicular to the layers obviates the need for cleaving operations common to edge emitting lasers. The perpendicular orientation of the resonator also facilitates fabrication and wafer-level testing of individual lasers.

Two basic types of VCSEL designs are known to exist: one defines a current confinement region in a semiconductor DBR by means of an apertured, high resistivity ion implanted region, whereas the other defines the current confinement region by means of an apertured, high resistivity oxide layer.

In the ion-implanted approach, light ions (e.g., protons) are implanted at relatively deep depths within the VCSEL device (e.g., about 3 μm). However, due to ion straggle and other difficulties associated with deep ion implantation, this current guide must be relatively large (e.g., >10 μm). Both of these factors inhibit scaling the devices to smaller sizes. In addition, the ion-implanted VCSEL does not form any significant optical guiding; i.e., it does not provide refractive index guiding of transverse lasing modes, although there may be some gain guiding of the modes. As a result, these lasers typically have threshold currents >1 mA and operating currents >3 mA. Electrical power dissipation per laser is, therefore, at least several mW.

In contrast, the oxide confinement approach is scalable to much smaller dimensions (e.g., the current aperture may be as small as 3 μm), which allow for an order of magnitude decrease in both the threshold and operating currents. In addition, the apertured oxide layer also forms a refractive index guide which leads to transverse mode confinement, resulting in at least another factor of two reduction in these currents. Thus, the power dissipation per device can be reduced by at least a factor of twenty (to a fraction of a mW) compared to the ion implanted design.

However, oxide VCSELs have not yet proven to be as reliable as ion implanted VCSELs and may have a built-in stress problem. Moreover, the oxidation process is relatively unreproducible and hence is not conducive to high yields. More specifically, oxidation processes entail oxidizing a high-Al content Group III-V layer after being covered by other layers; i.e., the outer edges of the high Al-content layer are exposed to water vapor so that oxidation progresses inwardly over a relatively long lateral distance (e.g., 10 s per μm) and yet must be precisely stopped so as to leave a very small diameter (e.g., 3 μm) current guide unoxidized. This process entails controlling oxidation time, assuming knowledge of the oxidation rate of the high-Al content Group III-IV layer. However, this rate depends on many factors, including parameters of the process and dimensions and properties of the materials to be oxidized. Controlling all of these factors is very difficult.

Thus, a need remains in the art for a VCSEL design that provides for both current and optical confinement and yet is scaleable, reproducible, and amenable to array applications.

SUMMARY OF THE INVENTION

Accordingly, the present invention is directed to long wavelength vertical cavity surface emitting lasers (VCSELs) that substantially obviate one or more of the problems due to limitations and disadvantages of the related art.

An advantage of the present invention provides VCSELs having independently definable current and optical guides that provide unique forms of drive current and transverse mode confinement, respectively.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a long wavelength vertical cavity surface emitting laser (VCSEL) may, for example, include a first distributed Bragg reflector (DBR); a second DBR, wherein the second DBR includes an optical confinement structure and a current confinement structure; an active region between the first and second DBRs; and a dielectric structure directly contacting the second DBR.

In another aspect of the present invention, a method of forming a vertical cavity surface emitting laser (VCSEL) may, for example, include forming a first distributed Bragg reflector (DBR) over a substrate; forming an active region over the first DBR; forming a second DBR over the active region; forming a current confinement structure within the second DBR; forming an optical confinement structure from the second DBR; and forming a dielectric structure over the second DBR.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 illustrates a vertical cavity surface emitting laser (VCSEL) in accordance with a first embodiment of the present invention

DETAILED DESCRIPTION OF THE ILLUSTRATED EMBODIMENTS

Figure 2A:
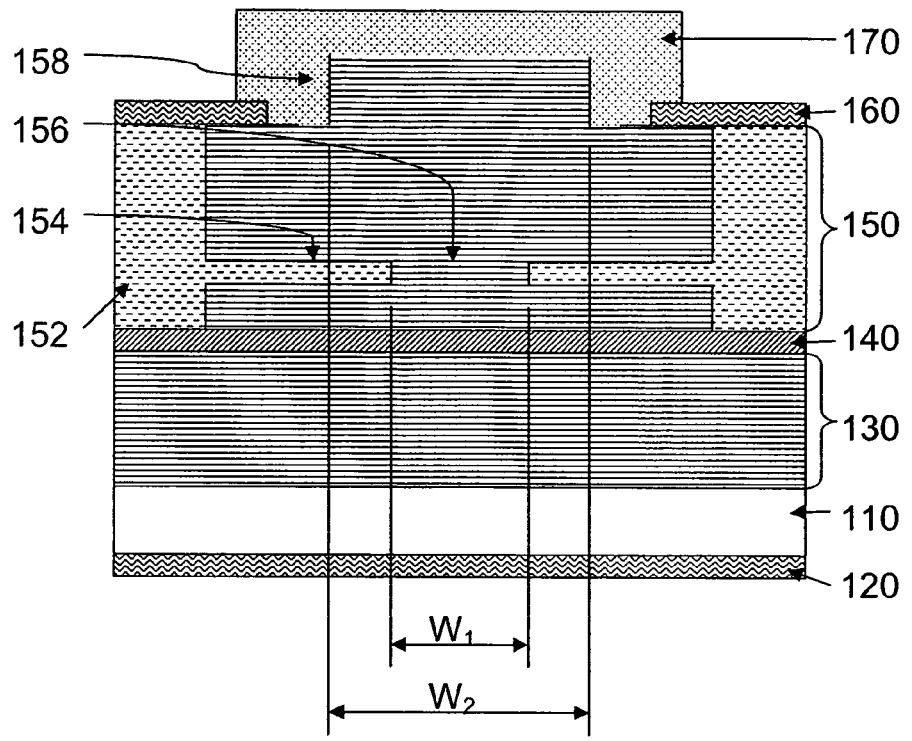
FIG. 2A illustrates a vertical cavity surface emitting laser (VCSEL) in accordance with a first embodiment of the present invention.

Reference will now be made in detail to embodiments of the present invention, examples of which are illustrated in the accompanying drawings.

The principles of the present invention may be extended to many material systems and combinations of materials within those material systems. For example, within GaAs material systems, individual semiconductor layers within mirror stacks, active regions, etc., may be formed of materials including, AlGaAs, AlGaInP, AlGaInAsP, GaInAsN, GaInAsNSb, AlGaInAsNSbP, InGaAsSb, AnInAsSb, and the like, and combinations thereof. Likewise, within InP material systems, individual layers within mirror stacks, active regions, etc., may be formed of materials including, for example, InAlGaAs, InGaAsP, AlGaAsSb, AlGaPSb, AlInAsSbP, and the like, and combinations thereof. Further, within GaSb or InAs material systems, individual layers within mirror stacks, active regions, etc., may be formed of materials including, for example, AlGaAsSb, AlGaPSb, AlGaAsPSb, AlGaSb, and the like, and combinations thereof. Other materials compatible with the principles of the present invention may, for example, include amorphous Si, InAs, AlP, GaP, GaAsN, and the like. It will be appreciated that all individual compositions within any of the compounds listed above may range from between about 0% and about 100%. It should be appreciated, however, that the aforementioned list is merely illustrative and not exhaustive. Therefore, combinations for mirror stacks (e.g., distributed Bragg reflectors) and quantum wells of active regions may include substantially any pairing of the above-listed materials into high and low band-gap pairs to achieve desired luminescence and reflection wavelengths. In one aspect of the present invention, heteroepitaxial growth techniques may be employed to grow materials may be grown on non-lattice-matched substrates. In another aspect of the present invention, predetermined materials may have purposefully altered compositions to produce lattice strained materials having beneficial properties.

Dielectric materials, either by themselves or combined with predetermined ones of the aforementioned semiconductor materials, may also be used in accordance with principles of the present invention. For example, individual dielectric layers within mirror stacks, passivation layers, etc., may be formed of materials including, $TiO_2$, $SiO_2$, $Si_3N_4$, MgO, $Al_2O_3$, $HfO_2$, $ZrO_2$, and the like, and combinations thereof. In one aspect of the present invention, any of the aforementioned dielectric materials may be layered with amorphous Si. Therefore, combinations for mirror stacks (e.g., distributed Bragg reflectors) can include substantially any pairing of the above-listed materials into high and low refractive index pairs to create suitable distributed Bragg reflectors, anti-reflection coatings, and the like.

The principles of the present invention may be extended to many types of epitaxial growth and deposition techniques, suitable for forming layers of the materials listed above. For example, growth and deposition techniques capable of forming individual layers within the VCSEL of the present invention may include Metal Organic Chemical Vapor Deposition (MOCVD), Metal Organic Vapor Phase Epitaxy (MOVPE), Plasma Enhanced Chemical Vapor Deposition (PECVD), Molecular Beam Epitaxy (MBE), Liquid Phase Epitaxy (LPE), Gas Source Molecular Beam Epitaxy (GSMBE), Chemical Beam Epitaxy (CBE), Metal Organic Molecular Beam Epitaxy (MOMBE), Ion Beam Sputter (IBS), Ion Assisted Sputter (IAS), Electron Beam Vacuum Deposition (E-beam) (which may include, for example, sample heating and back sputtering), Thermal Vacuum Coating/Deposition (TVC), Ion Assisted Electron Beam Deposition (IAEB), Ion Assisted Ion Beam Sputter (IAIBS), and the like, and combinations thereof. Lastly, the principles of the present invention may also be extended to many types of material removal processes including, for example, Reactive Ion Etching (RIE), Deep Reactive Ion Etching (DRIE), Inductively Coupled Reactive Ion Etching (ICRIE) (which may, for example, include substrate heating), Electron Cyclotron Resonance Etching (ECRE), Chemically Assisted Ion Beam Etching (CAIBE), and the like.

Having described the various materials and material deposition, growth, and removal techniques, a schematic description of an exemplary VCSEL device contemplated by the principles of the present invention will now be described in greater detail with respect to FIG. 1.

Referring to FIG. 1, a VCSEL device 10 of the present invention may be illustratively described with respect to a plurality of sectional elements. The central sections A through D represent the aperture of the VCSEL device, peripheral sections E through H represent a radially symmetric volume that surrounds the aperture of the VCSEL device. It is appreciated that the VCSEL device may or may not be radially symmetric to accommodate efficient electrical contact schemes and to produce desired characteristics (e.g., polarization control, etc.). Generally, materials and structures included within sections A and E form top mirror and/or electrical contact structures; materials and structures included within sections B and F form active region and/or current confinement structures; materials and structures included within sections C and G form bottom mirror and/or electrical contact structures; and materials and structures included within sections D and H form substrate and/or additional coating structures.

According to principles of the present invention, section A1 may, for example, include semiconductor DBR material(s), dielectric DBR material(s), metal reflection coating(s), metal conductive coating(s), thermally conductive coating(s), and/or micro-lens(es) arranged in substantially any suitable configuration. Section A2 may, for example, include semiconductor DBR material(s), dielectric DBR material(s), intra-mirror conductive layer(s), thermally conductive coating(s), and/or etch stop layer(s) arranged in substantially any suitable configuration. Section A3 may, for example, include semiconductor DBR material(s), dielectric DBR material(s), intra-mirror conductive layer(s), tunnel junction layer(s), thermally conductive coating(s), etch stop layer(s), and/or metamorphic layer(s) arranged in substantially any suitable configuration. Section B1 may, for example, include tunnel junction layer(s), oxide-defined aperture(s), metamorphic layer(s), intra-cavity conductive layer(s), graded confinement layer(s), layer(s) having multiple-quantum wells, and/or etch stop layer(s) arranged in substantially any suitable configuration. Section B2 may, for example, include at least two layer having multiple-quantum wells. Section B3 may, for example, include tunnel junction layer(s), oxide-defined aperture(s), intra-cavity conductive layer(s), graded confinement layer(s), layer(s) having multiple-quantum wells, and/or etch stop layer(s) arranged in substantially any suitable configuration. Section C1 may, for example, include semiconductor DBR material(s), etch stop layer(s), intra-mirror conductive layer(s), and/or thermally conductive coating(s) arranged in substantially any suitable configuration. Section C2 may, for example, include semiconductor DBR material(s), dielectric DBR material(s), intra-mirror conductive layer(s), thermally conductive coating(s), and/or etch stop layer(s) arranged in substantially any suitable configuration. Section C3 may, for example, include semiconductor DBR material(s), dielectric DBR material(s), metal reflection coating(s), thermally conductive coating(s), etch stop layer(s), and/or wafer bonding material(s) arranged in substantially any suitable configuration. Section D1 may, for example, include a semiconductor substrate, glass substrate, metal substrate, and/or etched via(s). Section D2 may, for example, include a metal coating(s), dielectric coating(s), and/or anti-reflection coating(s) arranged in substantially any suitable configuration.

According to principles of the present invention, section E1 may, for example, include any of the materials and/or structures present within section A1. Further, at least a portion of section E1 may, for example, include an implant isolation structure, etched isolation structure, and/or anti-reflection coating arranged in substantially any suitable configuration. Section E2 may, for example, include any of the materials and/or structures present within section A2. Further, at least a portion of section E2 may, for example, include an implant isolation structure, etched isolation structure, intra-mirror oxidation layer, metal coating, anti-reflection coating, and/or current aperture implant structure arranged in substantially any suitable configuration. Section E3 may, for example, include any of the materials and/or structures present within section A3. Further, at least a portion of section E3 may, for example, include an implant isolation structure, etched isolation structure, aperture etch, metal coating, and/or current aperture implant structure arranged in substantially any suitable configuration. Section F1 may, for example, include any of the materials and/or structures present within section B1. Further, at least a portion of section F1 may, for example, include an implant isolation structure, etched isolation structure, oxidation layer, aperture etch, metal conductive coating, and/or current aperture implant structure arranged in substantially any suitable configuration. Section F2 may, for example, include any of the materials and/or structures present within section B2. Further, at least a portion of section F2 may, for example, include an implant isolation structure, etched isolation structure, oxidation layer, aperture etch, and/or current aperture implant structure arranged in substantially any suitable configuration. Section G1 may, for example, include any of the materials and/or structures present within section C1. Further, at least a portion of section G1 may, for example, include an implant isolation structure, etched isolation structure, oxidation layer, aperture etch, metal conductive coating, and/or current aperture implant structure arranged in substantially any suitable configuration. Section G2 may, for example, include any of the materials and/or structures present within section C2. Further, at least a portion of section G2 may, for example, include a metal conductive coating, and/or current aperture implant structure arranged in substantially any suitable configuration. Section G3 may, for example, include any of the materials and/or structures present within section C3. Further, at least a portion of section G3 may, for example, include an anti-reflection coating, and/or current aperture implant structure arranged in substantially any suitable configuration. Section H1 may, for example, include any of the materials and/or structures present within section D1. Further, at least a portion of section H1 may, for example, include a metal conductive coating. Section H2 may, for example, include any of the materials and/or structures present within section D2.

Having schematically described VCSEL sections above, exemplary VCSEL devices contemplated by the principles of the present invention will now be described in greater detail with respect to FIGS. 2A-5B.

Referring to FIG. 2A, a VCSEL 200 according to a first embodiment of the present invention may, for example, include an n-type InP substrate 110, a bottom metallic layer 120 formed on a bottom surface of the substrate 110, a semiconductive n-type bottom distributed Bragg reflector (DBR) 130 formed on an upper surface of the substrate 110, an active region 140 formed on the bottom DBR 130, a semiconductive p-type top DBR 150 formed on the active region 140, a top metallic layer 160 formed on the semiconductor top DBR 150, and a dielectric structure 170 formed on the semiconductor top DBR 150 and, optionally, over the metallic layer 160. In one aspect of the present invention, the interface between the dielectric structure 170 and the semiconductor top DBR 150 may be substantially free of voids. In another aspect of the present invention, the dielectric structure 170 may be provided as a multi-layered dielectric DBR.

In one aspect of the present invention, the top metallic layer 160 may serve to conduct heat away from the active region 140, reducing thermally induced optical distortion effects. In another aspect of the present invention, the top metallic layer 160 may be provided as an annular ring around an optical aperture 158 (described in greater detail below) having inner perimeter which is greater than an inner perimeter of a current aperture 156 (described in greater detail below).

According to principles of the present invention, the semiconductor top DBR 150 may, for include separately definable current and optical apertures 156 and 158, respectively. The current aperture 156 may, for example, be formed via known ion implantation techniques, or equivalents thereof. In one aspect of the present invention, the optical aperture 158 may, for example, be provided as a mesa structure formed by etching upper portions of the semiconductor top DBR 150 radially surrounding the optical axis of the VCSEL 100 prior to forming the metallic layer 160. Accordingly, after forming the metallic layer 160, the dielectric DBR 170 is formed to directly contact and surround the optical aperture 158.

According to principles of the present invention, an isolation region 152 may, for example, be provided within the semiconductor top DBR 150 by known ion implantation techniques. Optionally, the isolation region 152 may further be provided within at least a portion active region 140 and/or the semiconductor bottom DBR 130.

It should be noted that diameters, thicknesses, and vertical/horizontal placement of the optical and current apertures 156 and 158, respectively, in addition to the depth of the isolation region 152 within the VCSEL 100, may be optimized to achieve optimal performance. For example, the width $W_1$ of the current aperture 156 may be greater than, equal to, or less than the width $W_2$ of the optical aperture 158.

In one aspect of the present invention, the semiconductor bottom DBR 130 may, for example, include alternating layers of InAlGaAs and InAlAs, InGaAsP and InP, AlGaAsSb and InP, AlGaPSb and InP, or the like.

In one aspect of the present invention, the active region 140 may, for example, include multiple quantum wells grown from either strained InAlGaAs, or InGaAsP, and the like.

In one aspect of the present invention, the semiconductor top DBR 150 may, for example, include alternating layers of InAlGaAs and InAlAs, InGaAsP and InP, AlGaAsSb and InP, AlGaPSb and InP, or the like. The semiconductor top DBR 150 may include an isolation region 152 and a current confinement region 154 that defines a current aperture 156 through which electrical current may flow through the active region 140. The semiconductor top DBR 150 may also include an optical aperture region 158.

In one aspect of the present invention, the dielectric DBR 170 may, for example, include alternating layers of $TiO_2$ and $SiO_2$, $TiO_2$ and $Al_2O_3$, amorphous Si and MgO, $Si_3N_4$ and $SiO_2$, or the like.

While FIG. 2A illustrates the semiconductive bottom and top DBRs 130 and 150 as n- and p-type, respectively, it is appreciated that their conductivities may be reversed, wherein the bottom and top DBRs 130 and 150 comprise p- and n-type conductivities, respectively.

In one aspect of the present invention, a tunnel junction (not shown) may be arranged between the active region 140 and the semiconductor top or bottom DBR 150 or 130, respectively, allowing the use of two n- or p-type DBRs. Again, placement of the tunnel junction may be varied to optimize VCSEL performance. In one aspect of the present invention, the tunnel junction may, for example, include an InAs/AlAs superlattice, AlGaAsSb/InP heterojunctions, AlGaPSb/InP heterojunctions, or the like.

According to principles of the present invention, bottom and/or top graded electrical confinement layers (not shown) may be arranged between the active region 140 and respective ones of the semiconductive bottom and top DBRs 130 and 150. In one aspect of the present invention, the graded electrical confinement layers may comprise combinations of semiconductor materials lattice-matched to the substrate 110. For example, the electrical confinement layer may include varying compositions of InAlGaAs material.

According to principles of the present invention, a metallic thermal conduction layer (not shown) may be arranged between the active region 140 and the semiconductor bottom and/or top DBR 130 and/or 150, respectively, to conduct heat away from the active region 140 and reduce thermally induced optical distortion effects. An aperture larger than, and axially aligned with the current aperture 156 may be defined within the metallic thermal conduction layer to minimize any optical interference the metallic thermal conduction layer with photons resonating between the semiconductor top and bottom DBRs 150 and 130.

Figure 2B:
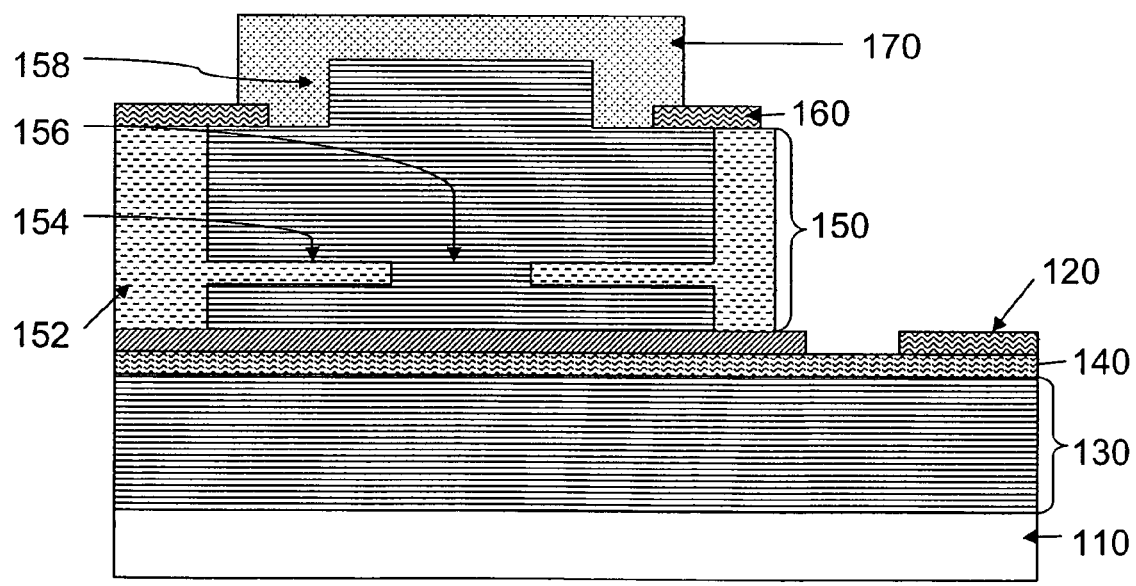
FIG. 2B illustrates a vertical cavity surface emitting laser (VCSEL) in accordance with a second embodiment of the present invention.

Referring to FIG. 2B, a VCSEL 300 according to a second embodiment of the present invention may, for example, be similar to the VCSEL of the first embodiment previously described with respect to FIG. 2A; however, portions of the VCSEL shown in FIG. 2A (e.g., the semiconductor top DBR 150 and, optionally, the active region 140 and/or semiconductor lower DBR 130) may be removed (e.g., etched) down to at least a portion of semiconductor bottom DBR 130. Further, the bottom metallic layer 120 may be arranged over at least a portion of the exposed semiconductor bottom DBR 130. In a first aspect of the second embodiment, the semiconductor bottom DBR 130 may be provided as either an undoped or partially-doped DBR and an intracavity contact layer 180 may be arranged between the semiconductor bottom DBR 130 and the active region 140. In a second aspect of the second embodiment, the semiconductor bottom DBR 130 may be provided as a fully-doped DBR and the bottom metallic layer 120 may be formed directly on the semiconductor bottom DBR 130. In a third aspect of the second embodiment, the intracavity contact layer 180 may be arranged within the semiconductor bottom DBR 130, wherein the bottom metallic layer 120 directly contacts the intracavity contact layer 180.

Figure 3A:
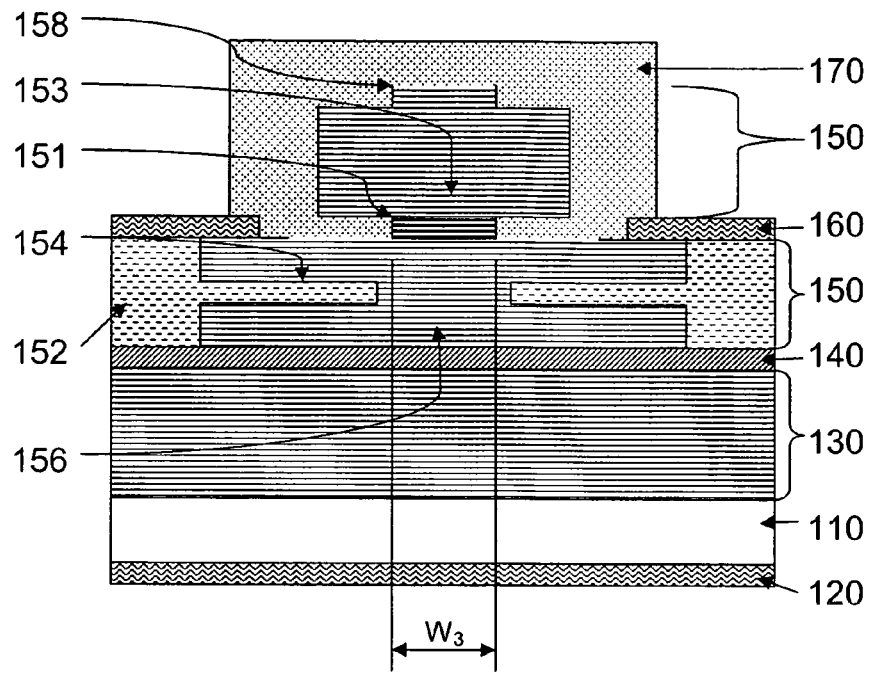
FIG. 3A illustrates a vertical cavity surface emitting laser (VCSEL) in accordance with a third embodiment of the present invention.

Referring to FIG. 3A, a VCSEL 400 according to a third embodiment of the present invention may, for example, be similar to the VCSEL of the first embodiment previously described with respect to FIG. 2A; however, the semiconductor top DBR 150 may, for example, include at least one intracavity optical aperture 153 to supplement the optical aperture 158. Alternatively, the intracavity optical aperture 153 may be implemented without the optical aperture 158. Accordingly, the semiconductor top DBR 150 may include at least one optical confinement layer 151 that may be etched at a higher rate than other layers within the semiconductor top DBR 150. After forming the optical aperture 158, a portion of the semiconductor top DBR 150 radially surrounding the optical aperture 158 may be removed (e.g., etched) to expose a thickness of the optical confinement layer 151. Subsequently, a lateral etch process may be performed on the exposed optical confinement layer 151. The lateral etch may thus selectively remove peripheral portions of the optical confinement layer 151 with respect to other exposed layers of the semiconductor top DBR 150 to form an intracavity optical aperture 153.

To properly form the intracavity optical aperture 153, the optical confinement layer 151 may be formed of substantially any suitable material that etches more quickly than the material above or below it. Because the respective layers are not "masked" along the vertical walls of the etched semiconductor top DBR 150, it should be noted that the lateral etching of the optical confinement layer 151 may also result in some etching of the semiconductor top DBR 150. In one aspect of the present invention, the material of the optical confinement layer 151 may have the same components as the material above or below it; however, the relative amounts of each component may be varied to create a material having a significantly higher etch rate (e.g., by a factor of at least 2) than etch rates of the surrounding material. For example, InGaAs with an In mole fraction of 0.01 to 0.2 may be used as an optical confinement layer 151. In one aspect of the present invention, a semiconductor etch stop layer (not shown) may be formed immediately under the optical confinement layer 151 to prevent unwanted etching of underlying DBR layers.

It should be noted that diameters, thicknesses, and vertical/horizontal placement of the intracavity optical aperture 153, relative to the current aperture 156 and/or the mesa-type optical aperture 158, may be optimized to achieve optimal performance. For example, the width $W_3$ of the intracavity optical aperture 158 may be greater than, equal to, or less than the widths $W_1$ or $W_2$ of any of the current or mesa-type optical apertures 156 or 158, respectively.

Further according to the third embodiment, the dielectric structure 170 may be provided as dielectric passivation layer including a single dielectric material. In one aspect of the present invention, the dielectric passivation layer 170 may be formed by substantially any suitable method.

Figure 3B:
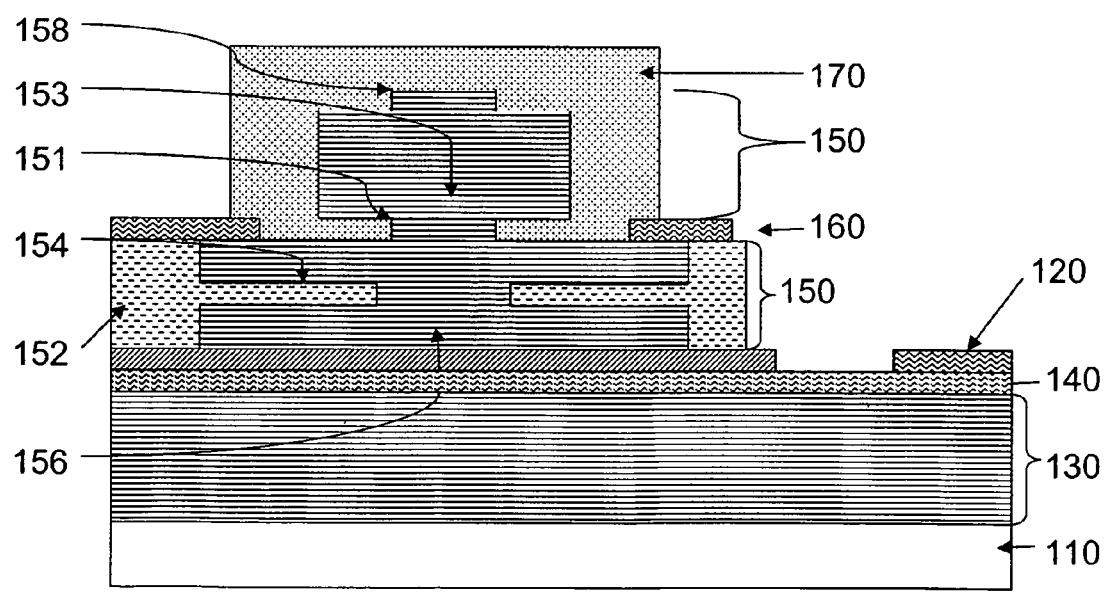
FIG. 3B illustrates a vertical cavity surface emitting laser (VCSEL) in accordance with a fourth embodiment of the present invention.

Referring to FIG. 3B, a VCSEL 500 according to a fourth embodiment of the present invention may, for example, be similar to the VCSEL of the second embodiment previously described with respect to FIG. 2B; however, the semiconductor top DBR 150 may include the at least one intracavity optical aperture 153 discussed above with respect to FIG. 3A.

Figure 4A:
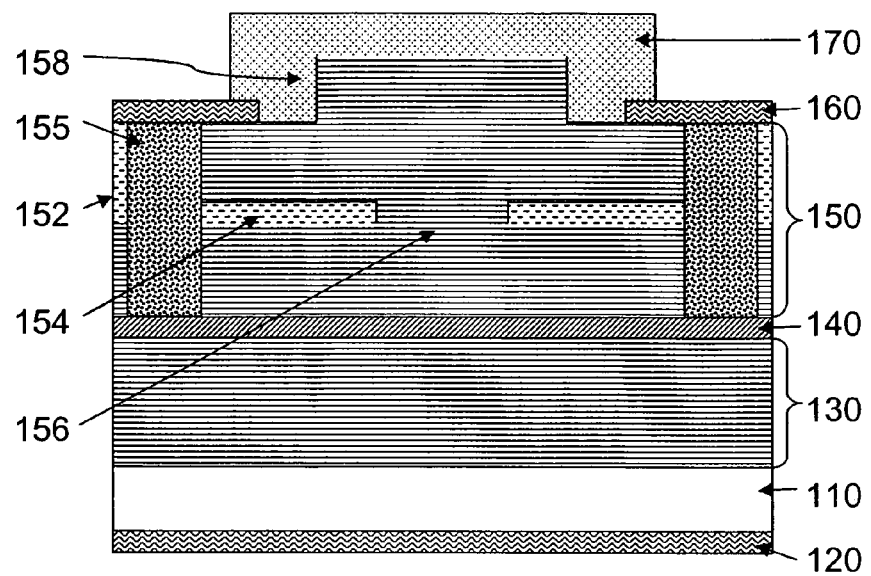
FIG. 4A illustrates a vertical cavity surface emitting laser (VCSEL) in accordance with a fifth embodiment of the present invention.

Referring to FIG. 4A, a VCSEL 600 according to a fifth embodiment of the present invention may, for example, be similar to the VCSEL of the first embodiment previously described with respect to FIG. 2A; however, adjacent VCSEL devices may be substantially electrically isolated via a trench design 155. In one aspect of the present invention, the trench design 155 may, for example, include an annular trench structure surrounding the optical aperture 158 filled with a low dielectric constant material such as benzocyclobutane (BCB) or the like. In another aspect of the present invention, the trench structure may, for example, include a plurality of separate trenches formed around the optical aperture 158 filled with a low dielectric constant material.

Figure 4B:
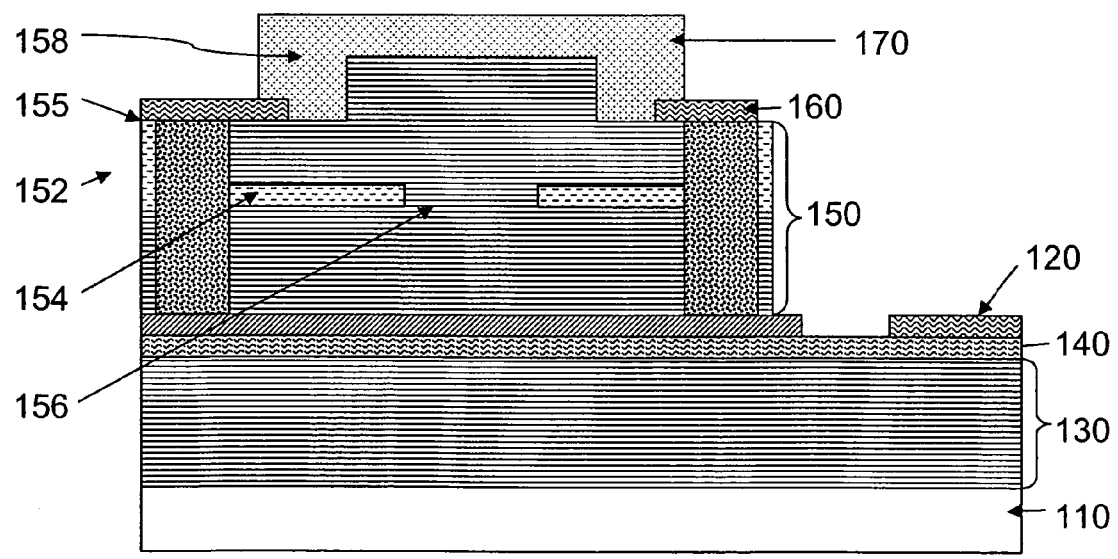
FIG. 4B illustrates a vertical cavity surface emitting laser (VCSEL) in accordance with a sixth embodiment of the present invention.

Referring to FIG. 4B, a VCSEL 700 according to a sixth embodiment of the present invention may, for example, be similar to the VCSEL of the fifth embodiment previously described with respect to FIG. 2B; however, the semiconductor top DBR 150 may include the trench design 155 discussed above with respect to FIG. 4A.

Figure 5A:
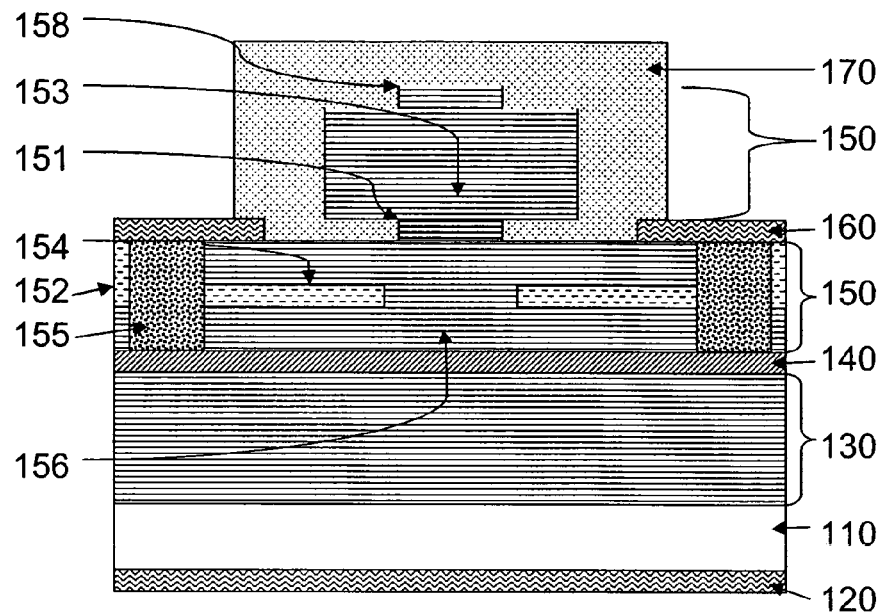
FIG. 5A illustrates a vertical cavity surface emitting laser (VCSEL) in accordance with a seventh embodiment of the present invention.

Referring to FIG. 5A, a VCSEL 800 according to a seventh embodiment of the present invention may, for example, be similar to the VCSEL previously described with respect to FIG. 3A; however, the semiconductor top DBR 150 may include the trench design 155 discussed above with respect to FIG. 4A.

Figure 5B:
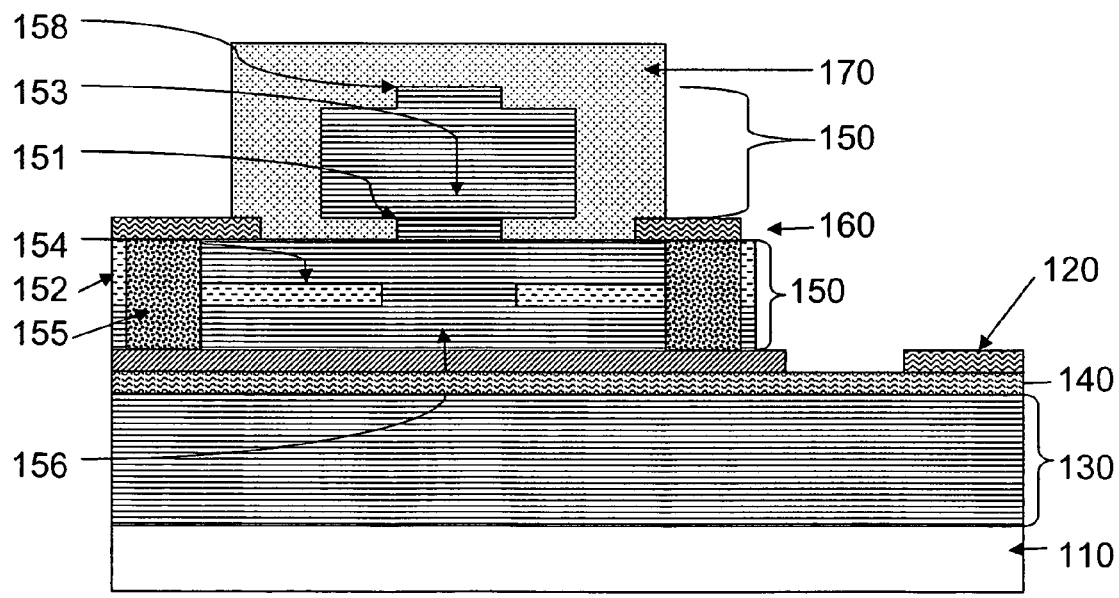
FIG. 5B illustrates a vertical cavity surface emitting laser (VCSEL) in accordance with an eighth embodiment of the present invention.

Referring to FIG. 5B, a VCSEL 900 according to an eighth embodiment of the present invention may, for example, be similar to the VCSEL previously described with respect to FIG. 3B; however, the semiconductor top DBR 150 may include the trench design 155 discussed above with respect to FIG. 4B.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A vertical cavity surface emitting laser (VCSEL), comprising:
    a first distributed Bragg reflector (DBR);
    a second DBR, wherein the second DBR includes a first optical aperture and a current aperture, wherein the second DBR further includes a second optical aperture, the second optical aperture including an intracavity optical confinement structure;
    an active region between the first and second DBRs; and
    a dielectric structure directly contacting the second DBR, wherein the first optical aperture and the dielectric structure are formed such that the dielectric structure covers an upper surface of the first optical aperture and at least partially covers one or more sidewalls of the first optical aperture.

2. The VCSEL of claim 1, wherein the current aperture is at least partially defined by an ion-implanted region of the second DBR.

3. The VCSEL of claim 1, wherein the first optical aperture includes a mesa structure at an upper portion of the second DBR.

4. A vertical cavity surface emitting laser (VCSEL), comprising:
    a first distributed Bragg reflector (DBR);
    a second DBR, wherein the second DBR includes a first optical aperture and a current aperture;
    an active region between the first and second DBRs; and
    a dielectric structure directly contacting the second DBR, wherein the first optical aperture and the dielectric structure are formed such that the dielectric structure covers an upper surface of the first optical aperture and at least partially covers one or more sidewalls of the first optical aperture, wherein the dielectric structure includes a dielectric DBR.

5. The VCSEL of claim 1, wherein the dielectric structure includes a dielectric passivation layer.

6. The VCSEL of claim 1, further comprising:
    a first metallic layer; and
    a second metallic layer, wherein the active region is between the first and second metallic layers.

7. The VCSEL of claim 6, wherein the first metallic layer is an intracavity contact.

8. The VCSEL of claim 1, further comprising at least one trench in the second DBR.

9. The VCSEL of claim 8, further comprising dielectric material within the at least one trench.

10. A method of forming a vertical cavity surface emitting laser (VCSEL), comprising:
    forming a first distributed Bragg reflector (DBR) over a substrate;
    forming an active region over the first DBR;
    forming a second DBR over the active region;
    forming a current aperture within the second DBR;
    forming an optical aperture from the second DBR; and
    forming a dielectric structure over the optical aperture such that the dielectric structure radially surrounds, at least in part, one or more sidewalls of the first optical aperture that extend parallel to an optical axis of the first optical aperture, wherein forming the dielectric structure includes forming a dielectric DBR.

11. The method of claim 10, wherein forming the current aperture includes ion-implanting a region of the second DBR that at least partially defines the current aperture.

12. The method of claim 10, wherein forming the dielectric structure includes forming a dielectric passivation layer.

13. The method of claim 10, further comprising etching at least one trench within the second DBR.

14. The method of claim 13, further comprising filling the at least one trench with dielectric material.

15. The method of claim 10, further comprising forming a metallic contact on the second DBR after forming the optical aperture.

16. The VCSEL of claim 1, wherein the width of the current aperture is less than the width of the optical aperture.

17. The method of claim 15, wherein the dielectric structure directly contacts the metallic contact.

18. The VCSEL of claim 1, wherein the dielectric structure includes a multi-layered dielectric DBR.

19. The VCSEL of claim 1, wherein the dielectric structure encloses a substantial portion of the first optical aperture.

20. The VCSEL of claim 4, wherein the current aperture is at least partially defined by an ion-implanted region of the second DBR.

21. The VCSEL of claim 4, wherein the first optical aperture includes a mesa structure at an upper portion of the second DBR.

22. The VCSEL of claim 4, wherein the dielectric structure includes a dielectric passivation layer.

23. The VCSEL of claim 4, further comprising:
    a first metallic layer; and
    a second metallic layer, wherein the active region is between the first and second metallic layers.

* * * * *